United States Patent
Ranish et al.

(10) Patent No.: US 8,314,368 B2
(45) Date of Patent: Nov. 20, 2012

(54) SILVER REFLECTORS FOR SEMICONDUCTOR PROCESSING CHAMBERS

(75) Inventors: Joseph M. Ranish, San Jose, CA (US); Kelly Churton, Sunnyvale, CA (US); Mark E. Lindsay, Campbell, CA (US); Mischa Ann Plesha, Santa Clara, CA (US); Sage Berta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 958 days.

(21) Appl. No.: 12/036,078

(22) Filed: Feb. 22, 2008

(65) Prior Publication Data

US 2009/0212037 A1 Aug. 27, 2009

(51) Int. Cl.
- F27B 5/14 (2006.01)
- F27D 11/00 (2006.01)
- F21V 7/10 (2006.01)
- F21V 7/22 (2006.01)
- G02B 17/00 (2006.01)

(52) U.S. Cl. ........ 219/405; 219/411; 392/411; 392/416; 392/422; 118/725

(58) Field of Classification Search ............... None
See application file for complete search history.

(56) References Cited

U.S. PATENT DOCUMENTS

| | | | |
|---|---|---|---|
| 4,713,824 A | 12/1987 | Heller | |
| 5,019,458 A | 5/1991 | Elgat | |
| 5,155,336 A | 10/1992 | Grovet et al. | |
| 5,892,886 A * | 4/1999 | Sandhu | 392/416 |
| 6,013,900 A * | 1/2000 | Westerberg et al. | 219/405 |
| 6,064,800 A * | 5/2000 | Sandhu | 392/416 |
| 6,072,160 A | 6/2000 | Bahl | |
| 6,232,580 B1 * | 5/2001 | Sandhu | 219/390 |
| 6,310,327 B1 * | 10/2001 | Moore et al. | 219/405 |
| 6,376,806 B2 | 4/2002 | Yoo | |
| 6,417,494 B1 * | 7/2002 | Westerberg et al. | 219/402 |
| 6,437,290 B1 * | 8/2002 | Shao et al. | 219/390 |
| 6,717,158 B1 * | 4/2004 | Gat et al. | 250/492.2 |
| 6,805,466 B1 | 10/2004 | Ranish | |
| 6,825,615 B2 * | 11/2004 | Shigeoka | 313/635 |
| 6,970,644 B2 * | 11/2005 | Koren et al. | 392/418 |
| 7,045,746 B2 * | 5/2006 | Devine et al. | 219/411 |
| 7,164,134 B2 * | 1/2007 | Wei et al. | 250/368 |
| 7,445,952 B2 * | 11/2008 | Kondo et al. | 438/69 |
| 7,525,068 B2 * | 4/2009 | Jang et al. | 219/390 |
| 7,547,633 B2 * | 6/2009 | Ranish et al. | 438/687 |

(Continued)

FOREIGN PATENT DOCUMENTS

CN 1914524 2/2007

(Continued)

OTHER PUBLICATIONS

JP 2000-019313 A, Jan. 2000, Reflector, Kawamoto et al, partial translation.*

(Continued)

*Primary Examiner* — Joseph M Pelham

(74) *Attorney, Agent, or Firm* — Diehl Servilla LLC

(57) ABSTRACT

A silver reflector for reflecting radiation from a lamp in a semiconductor processing chamber is disclosed. The reflector may be a sleeve to be disposed in a lightpipe or part of a lamphead. The silver may be in the form of a coating on the sleeve or the lamphead.

18 Claims, 5 Drawing Sheets

U.S. PATENT DOCUMENTS

| | | | |
|---|---|---|---|
| 7,653,338 B2* | 1/2010 | Kim et al. .................... 399/330 |
| 2004/0125593 A1 | 7/2004 | Nam | |
| 2005/0098553 A1* | 5/2005 | Devine et al. ................. 219/411 |
| 2005/0213949 A1* | 9/2005 | Koren et al. .................. 392/416 |
| 2006/0066193 A1 | 3/2006 | Ranish et al. | |
| 2007/0262071 A1* | 11/2007 | Matzenmuller et al. ...... 219/405 |
| 2008/0067416 A1* | 3/2008 | Ranish et al. ............ 250/455.11 |

FOREIGN PATENT DOCUMENTS

| | | | |
|---|---|---|---|
| DE | 4002630 A1 * | 8/1991 | |
| EP | 1720046 | 11/2006 | |
| JP | 2000019313 A * | 1/2000 | |
| JP | 2003016821 A * | 1/2003 | |

OTHER PUBLICATIONS

"PCT International Search Report and Written Opinion mailed Jul. 29, 2009 for International Application No. PCT/US2009/034614 filed Feb. 20, 2009", 12 pgs.

Belleville, Philippe et al., "Use of Sol-Gel Hybrids for Laser Optical Thin Films", *Mat. Res. Soc. Symp. Proc.* vol. 726 2002, Q11.6.1-11.6.12.

Farmer, J. et al., "Atmospheric Tarnishing of Silver-Plated Laser Mirrors", *Lawrence Livermore National Laboratory* Oct. 1997, 6 pgs.

Kennedy, C. E. et al., "Optical Durability of Candidate Solar Reflectors", *Transactions of the ASME* Vo. 127 May 2005, 262-269.

Morales, A. et al., "Sol-Gel Protection of Front Surface Silver and Aluminum Mirrors", *Journal of Sol-Gel Science and Technology* 8 1997, 451-457.

Stevenson, Ian C. et al., "X-1 Silver: A High Durability Silver Coating for Use in Harsh Environments", *Society of Vacuum Coaters 43rd Annual Technical Conference Proceedings* 2000, 1 pg.

Thomas, Norman et al., "Prevention of Corrosion of Silver Reflectors for the National Ignition Facility", *SPIE* vol. 3427 1998, 394-400.

"Supplementary European Search Report in Application No. EP09736547", dated Apr. 12, 2012, 5 pages.

* cited by examiner

SILVER REFLECTORS FOR SEMICONDUCTOR PROCESSING CHAMBERS

TECHNICAL FIELD

One or more embodiments of the present invention relate to processing a substrate inside a high temperature semiconductor processing chamber.

BACKGROUND

A number of applications that involve the thermal processing of substrates such as semiconductor wafers and other materials involve the process steps of rapidly heating and cooling a substrate. One example of such processing is rapid thermal processing (RTP), which is used for a number of fabrication processes.

Rapid thermal processing (RTP) systems are employed in semiconductor chip fabrication to create, chemically alter or etch surface structures on semiconductor wafers. One such RTP system, as described in U.S. Pat. No. 5,155,336, which is assigned to the assignee of the subject application and which is incorporated herein by reference, includes a semiconductor processing chamber and a heat source assembly or lamphead located on the semiconductor processing chamber. A number of infrared lamps are located in the lamphead. During processing, infrared radiation from the lamps radiate through an upper window, light passageways and a lower window onto a rotating semiconductor substrate in the processing chamber. In this manner, the wafer is heated to a required processing temperature. During semiconductor processing operations, the lamps operate at extremely high temperatures. Not all of the electrical energy delivered to an RTP chamber lamphead ends up actually heating the wafer. Some of the radiant energy is absorbed by chamber components, especially the reflective components in the radiation field.

A heating lamp may be contained in an assembly having a reflector sleeve, for example, as described in U.S. Pat. No. 6,072,160, which is assigned to the assignee of the present application and which is incorporated herein by reference in its entirety. A heating lamp may also be contained in a monolithic lamphead having a plurality of lamp receptacles as described in U.S. Pat. No. 6,805,466, which is assigned to the assignee of the subject application, and which is incorporated herein by reference in its entirety.

In general, reflector sleeves or a monolithic lamphead have a reflective layer which contains a layer or coating made of gold. However, gold does not have optimal reflective properties compared to silver. In addition, gold is substantially more expensive than silver. However, silver has not been used as a reflective material in lamps due to a severe problem of the silver tarnishing, which renders silver useless as a reflective material because the surface of the silver turns black, destroying the ability of it to reflect. Accordingly, novel and improved reflectors, reflector materials and methods for improved reflection of radiation are required for RTP and semiconductor processing applications.

SUMMARY

In accordance with one embodiment of the present invention, a reflector is provided for use in a semiconductor processing chamber comprising a reflector substrate disposed in the processing chamber to reflect radiation originating from a heating lamp mounted in the semiconductor processing chamber, the reflector substrate including a reflective layer disposed thereon comprising silver. In one embodiment the reflective layer is made of extremely pure silver with a silver content greater than 99.99%.

In one or more embodiments, the reflector further comprises a substantially transparent layer covering the reflective layer. In embodiments that utilize a transparent layer, the substantially transparent layer comprises a material selected from quartz, alumina, zirconia, $Si_3N_4$, zirconia, $Si_3N_4$, $CaF_2$, $MgF_2$, $TiO_2$, $Ta_2O_5$, $HfO_2$, yttria, and alumina-silica glass.

Embodiments that include a reflective layer may further comprise an adhesion layer between the reflective layer and a transparent layer. Alternatively, a diffusion barrier may be disposed between the reflective layer and the reflector substrate.

In one or more embodiments, the reflector substrate comprises a portion of monolithic lamphead having a plurality of cavities adapted to receive a lamp therein. In other embodiments, the reflector substrate comprises a sleeve adapted to be disposed within a light pipe of a semiconductor processing chamber.

The reflectors are suitable for use in Rapid Thermal Processing chambers and epitaxial processing chambers.

Another aspect of the invention pertains to a semiconductor processing apparatus, comprising a processing chamber having a support on which a substrate may be positioned during processing; a heating lamp radiating radiant energy disposed within the chamber; and a reflector position to reflect radiation from the lamp, the reflector including a reflective layer substantially made of silver on a reflector substrate. In one or more embodiments, the reflector may be configured as describe above and further herein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 1:
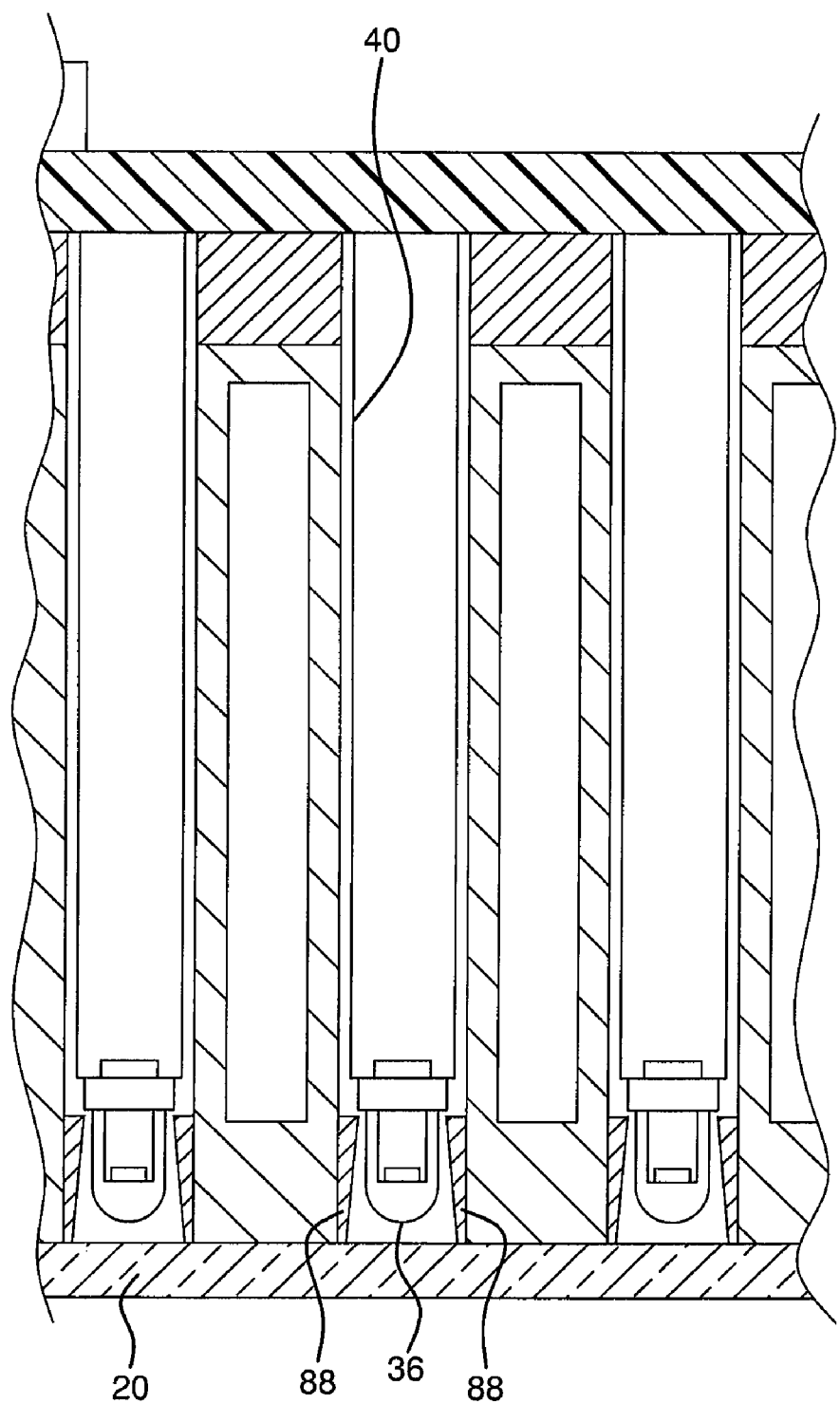
FIG. 1 is a diagram of a lamp assembly in accordance with an embodiment of the present invention.

FIG. 1 shows a diagram of an individual lamp assembly also known as a light pipe. Referring to FIG. 1, an illustrative embodiment of an assembly of a light pipe 40 with a lamp 36 disposed therein is shown. The light pipe 40 may be part of a lamphead assembly. The open end of the light pipe 40 is located adjacent to a window 20. The light pipe 40 in accordance with an embodiment of the present invention is provided with silver reflective sleeves 88.

Figure 2:
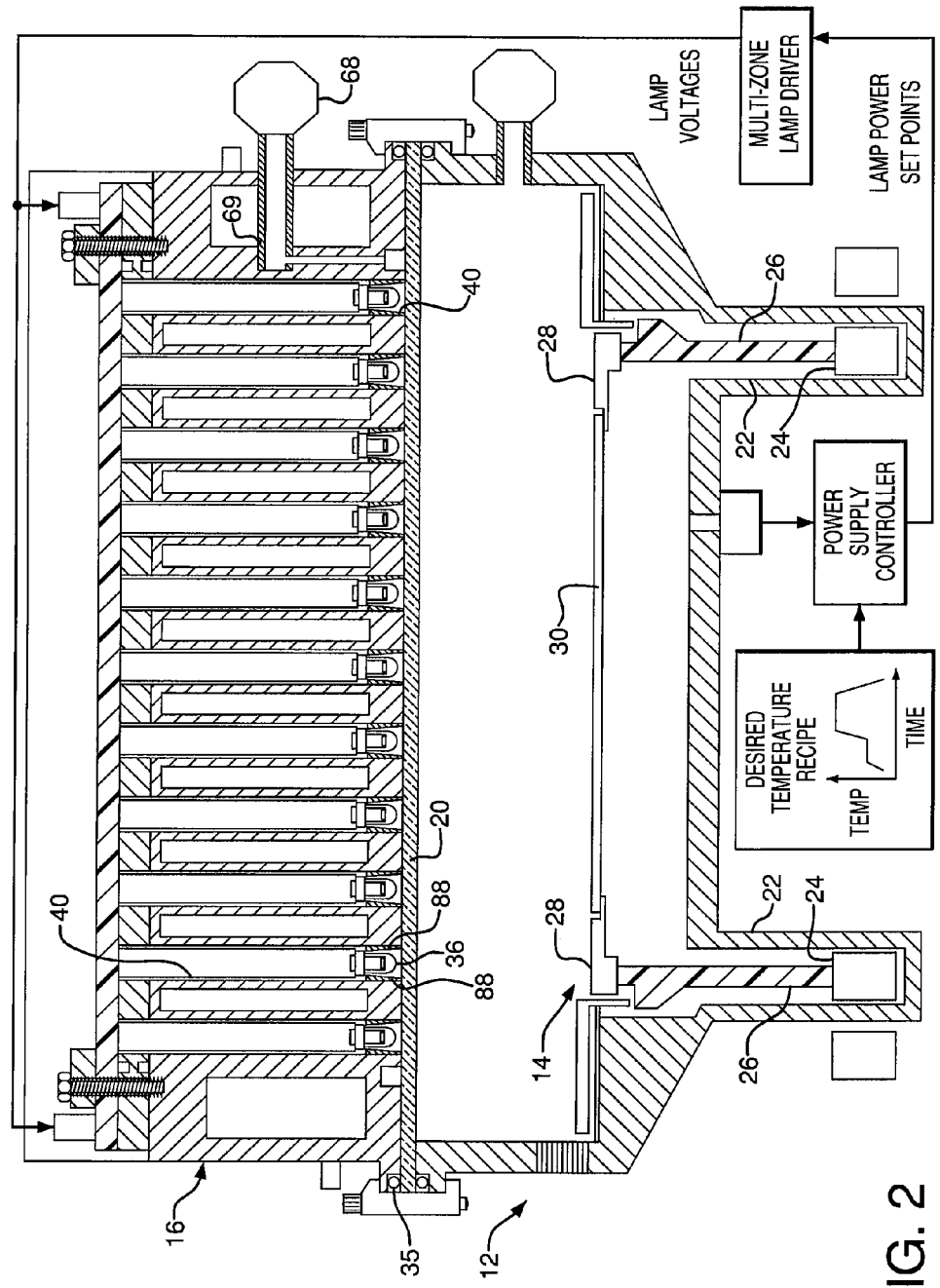
FIG. 2 is a diagram of a processing chamber in accordance with an embodiment of the present invention.

To provide a context for the use of a light pipe in a heating assembly for heating a substrate in a RTP processing chamber, a chamber diagram is provided in FIG. 2. In FIG. 2, a plurality of light pipes 40 is shown associated with a reduced-pressure or vacuum RTP chamber 12, a window 20, and a lamphead or heat source assembly 16 overlying the window 20. A substrate handling apparatus 14 includes a magnetically-levitated rotor 24 within the channel 22, a silicon-coated quartz support cylinder 26 resting on or otherwise coupled to the magnetic rotor, and a silicon-coated silicon carbide edge ring 28 resting on the support cylinder. During processing, a substrate or wafer 30 rests on the edge ring. The lamphead assembly 16 overlies the window 20. An O-ring 35 is located between the window and the lamphead to provide a vacuum seal at that interface. The lamphead includes a plurality of lamps 36 that are housed within lamp housing tubes or light pipes 40. Each light pipe 40 can include a reflective inner surface, which in accordance with an embodiment of the present invention, are silver reflective sleeves 88. In one embodiment, the lamps 36 are radiation emitting light bulbs such as tungsten-halogen lamps. The RTP chamber may also be used to process other sorts of substrates such as plastic panels, glass plates or disks and plastic workpieces.

The atmosphere of the chamber and of the lamphead 16 can be controlled. For instance, a vacuum pump 68 is provided which can reduce the pressure in the lamphead through channel 69 in fluid communication with the lamphead as is shown in FIG. 2. As noted above, silver has not been used as a reflective material because silver severely tarnishes in the lamphead environment.

In one embodiment of the invention, to prevent tarnishing of the silver reflector, the atmosphere around the lamps is controlled to substantially minimize the amount of sulfide-forming or sulfide-catalyzing materials on the silver. One way of doing is to ensure that the atmosphere is substantially free of $H_2S$ and moisture ($H_2O$). One way of providing such an atmosphere is to prevent atmospheric air from entering into the area around lamps, for example by flowing helium through channel 69. Another way would be by using a filter and/or getters in the channel 69 to remove $H_2S$ and moisture from the atmosphere surrounding the lamps. Sulfide getters, for example, metal oxides such as iron oxide are known.

Specular reflector 88 may be formed as a sleeve disposed within light pipe 40. Alternatively, specular reflector 88 may be an integral part of light pipe 40. The more reflective the surface of reflector 88, the more energy is reflected to reach a substrate 30 in chamber 12. Accordingly, the face of specular reflector 88 is polished to improve reflectivity. Polishing may be accomplished by slowly machining specular reflector 88, or by the use of a polishing or buffing wheel after machining.

Figure 3:
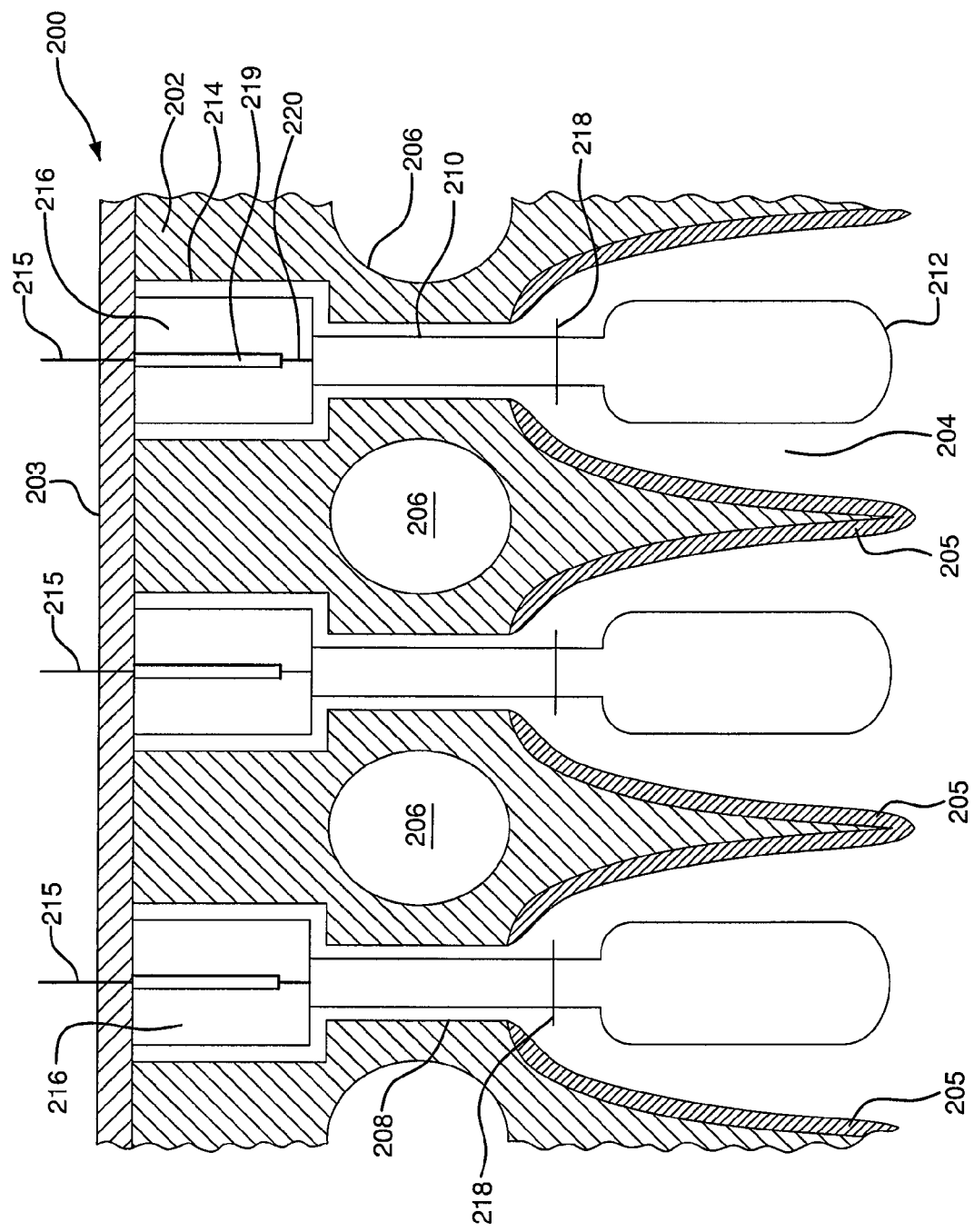
FIG. 3 is a diagram of a lamphead in accordance with an embodiment of the present invention.

In an alternative embodiment, heating lamps are placed in receptacles in a monolithic member forming a lamphead 200 as shown in FIG. 3. The lamphead 200 comprises a plurality of receptacles with a reflector cavity 204 containing a lamp 212. It will be understood that the lamphead 200 could be substituted for the plurality of light pipes 40 shown in FIG. 2.

In the lamphead shown in FIG. 3, a plurality of circular coolant passages 206 are formed into the monolithic lamphead, in close proximity to the reflector cavities 204. The coolant passages 206 transport a cooling fluid such as water. The cooling fluid is introduced into the coolant passages via an inlet and removed at an outlet (not shown). A plurality of lead passages 208 are also formed in the lamphead-reflector 202. The lead passages 208 are sized to accept a press seal 210 of a lamp 212. A lamp shrink seal could also be used. Light from the lamps 212 is directed toward a substrate in the processing chamber by the reflector cavities.

A plurality of lampholder receptacles 214 are formed in the monolithic lamphead-reflector to receive lamp sockets or lampholders 216. Lampholders 216 have receptacles 219 that receive the outer two leads or pins 220 of the lamps. The lamp leads are electrically connected via receptacles 219 to respective wires of wiring pair 215, which provide power to the lamps. The lampholder receptacles support the lamps when they are plugged into the lamphead.

Each lamp includes a radiation shield 218 to prevent lamp radiation from entering the lead passage 208. The radiation shield may be made of an aluminum, stainless steel or chrome-plated steel. The lamps have no base other than the press seal or shrink seal, depending on which one is used. The lamp leads, as noted, engage directly into the lampholder to complete the electrical circuit. The outer lead or lamp seal can include features to enable a sound mechanical retention of the lamp, such as indents, which engage spring-loaded pins in the lampholder. A backing plate 203 can be secured to the uppermost surface of the lamphead-reflector 202 to hold the lampholders 216 within the lampholder receptacles 214.

According to the prior art, after polishing, the surface of sleeve 88 shown in FIG. 2 is gold plated to prevent the surface from oxidizing and to maintain a high level of reflectivity. In order to prevent migration of gold into specular reflector sleeve 88, a nickel diffusion barrier is placed on the surface prior to gold plating. The nickel barrier is applied using standard electroless nickel plating techniques, and thereafter high purity gold is applied by gold plating. Similarly, according to the prior art, the reflector cavity 204 shown in FIG. 3 has a reflecting coating 205, which in general includes gold as a reflective material. As used herein, the phrase "reflector substrate" includes reflector sleeves 88 of the type shown in FIG. 2 and reflector cavities 204 of the type shown in FIG. 3.

Not all the electrical energy delivered to an RTP chamber lamphead ends up actually heating the wafer. Some of the radiant energy is absorbed by chamber components, especially the reflective components in the radiation field. In accordance with one embodiment of the present invention, the gold reflective material described above is replaced by silver, which increases the efficiency of radiant energy delivery from lamp-reflector assembly to the substrate to be processed. Using silver as a reflective material increases the amount of radiation absorbed by the substrate to be processed by returning more of the unabsorbed "first bounce" radiation back to the wafer. It also reduces the heat loading on the lamphead and increases system efficiency. Use of silver as a reflective material is likely to be much cheaper than current technology as silver material cost per unit is currently about 2% that of gold. However, despite the cost savings, the problem of silver tarnishing has prevented the use of silver as a reflector material in the lamphead.

In accordance with one embodiment of the present invention, the gold coated reflector sleeves RTP chambers are replaced with silver coated reflector sleeves. The higher reflectivity and much lower cost of silver versus gold increases the overall system efficiency enabling higher performance at lower cost of both energy and materials.

However, the replacement of the gold coating with a silver coating is not straightforward and not without problems and challenges. One concern and problem in applying silver as a coating is the potential tarnishing of silver in certain environments such as those encountered inside RTP chambers. It has been determined that discoloration from oxidizing agents per se can be largely avoided by using pure silver, greater than about 99.9% Ag. Tarnishing from sulfides can be practically reduced by providing a sulfide-free atmosphere in the lamphead as discussed above or by overcoating the silver with a transparent protective coating. Tarnishing can also be minimized by reducing the moisture in the lamphead atmosphere, since moisture facilitates the tarnish reaction. Another issue encountered in the implementation of a silver coating was relatively poor adhesion to the lamphead or sleeve. Adhesion to the substrate of the silver may be facilitated by using an adhesion layer and silver contamination by temperature enhanced diffusion of certain substrate materials may be reduced or practically eliminated by applying a diffusion barrier, such as Ni, and Ni—Cr alloys, including nitrided N—Cr alloys as well as judicious choice of substrate material.

Current RTP processing chambers such as the reduced pressure process Applied Materials RTP chambers already have a controlled atmosphere in the lamphead, so the reflector sleeves are already protected from exposure to sulfides (or can be made so if it turns out that some of the lamphead components contain sulfur.) Aside from manufacturing, the reflectors would only potentially be exposed to the ambient atmosphere during the limited times when the cold lamphead is opened to replace lamps. Depending on air quality of the fabrication atmosphere in which the lamphead is operated, this exposure time may not result in significant tarnishing and unprotected silver may be used according to certain embodiments. Practical exposure times to the fabrication air could be increased by covering the lamphead with a thin silver foil or silver-paper dosed with sulfide scavenging chemicals.

In the event an uncoated silver coating on a lamphead or sleeve is tarnished, it can be recovered or refurbished. Tarnished silver may be recovered or refurbished by, for example, hydrogen atom processing as well as by applying solution cleaning techniques.

In accordance with a further embodiment of the present invention, silver-based reflectors may be used in epi (epitaxial) processing chambers. If silver-based reflectors are used in epi chambers, a sulfide or moisture scrubber/absorber in the cooling air flow or the use of a sulfide-free cooling gas may be included to enable the use of unprotected silver. Otherwise, a protective coating for a silver-based reflector or periodic cleaning would be required.

In accordance with another embodiment of the present invention, a transparent protective overcoat over the silver coating is provided to protect the silver reflector material only during lamphead maintenance. The longevity requirements of this overcoat are not as stringent as for other applications such as solar collectors or space telescopes. Suitable materials for transparent protective coatings for silver containing reflecting material are silica, quartz, alumina, zirconia, $Si_3N_4$, zirconia, $Si_3N_4$, $CaF_2$, $MgF_2$, $TiO_2$, $Ta_2O_5$, $HfO_2$, yttria, and alumina-silica glass.

Silica-based coatings may be derived from sol gels. Such silica-based coatings have shown promise in both solar and laser applications. For lower temperature processes, transparent polymer based coatings may be useful. The higher temperature versions of these are preferably silicone and/or fluoro-polymer based. It has been shown that 100 Angstrom silicon nitride with nichrome or nitrided nichrome adhesion layers adequately protects silver from atmospheric tarnishing for years. With these types of coatings, it may be possible to use silver as a reflector even without a protective atmosphere in the lamphead. However, most silicon nitride coating techniques are line-of-sight techniques, and may be less suitable for coating the inner diameter of reflector sleeves. Nevertheless, it is worth applying such techniques especially if a protective atmosphere is provided over most of the lifetime of the reflector and minimal tarnish protection is required. For the application in processing chambers, it may be desirable to cover a coating comprising silver with a very thin layer such as a flash coating of metals such as gold, platinum, rhodium, and palladium or a silver-alloy flash coating to prevent the silver from tarnishing. Alternately, an alloying agent such as Si or Ge may be added to the silver in amounts small enough so as not to seriously diminish the reflectivity of pure silver but large enough so as to form a protective oxide layer.

Figure 4:
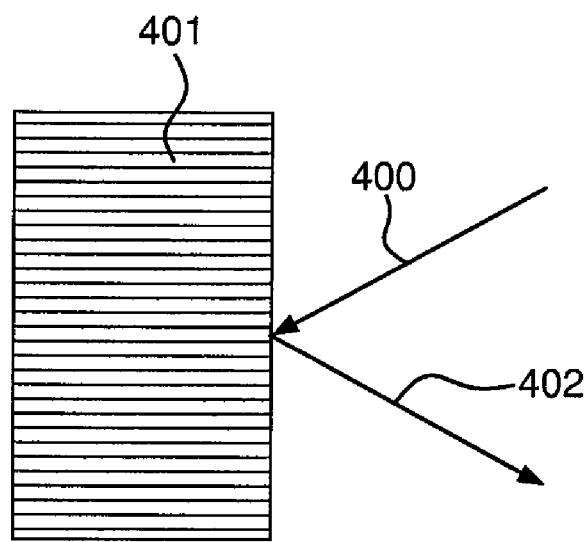
FIG. 4 is a diagram of a part of a reflector in accordance with an embodiment of the present invention.
Figure 5:
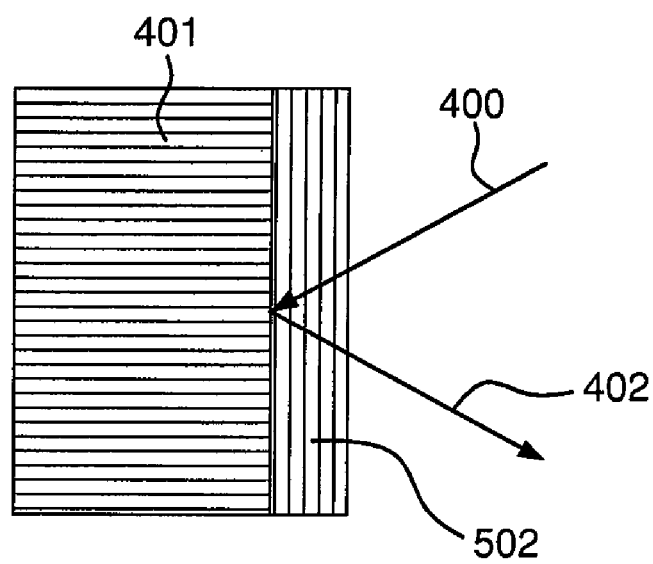
FIG. 5 is another diagram of a part of a reflector in accordance with a further embodiment of the present invention.
Figure 6:
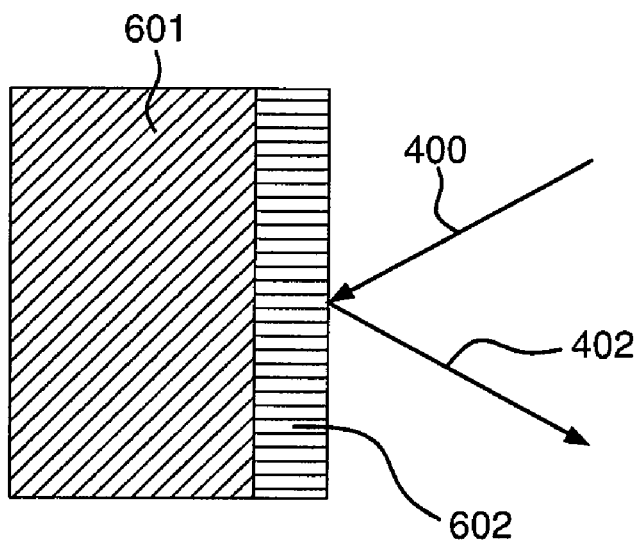
FIG. 6 is another diagram of a part of a reflector in accordance with yet a further embodiment of the present invention.
Figure 7:
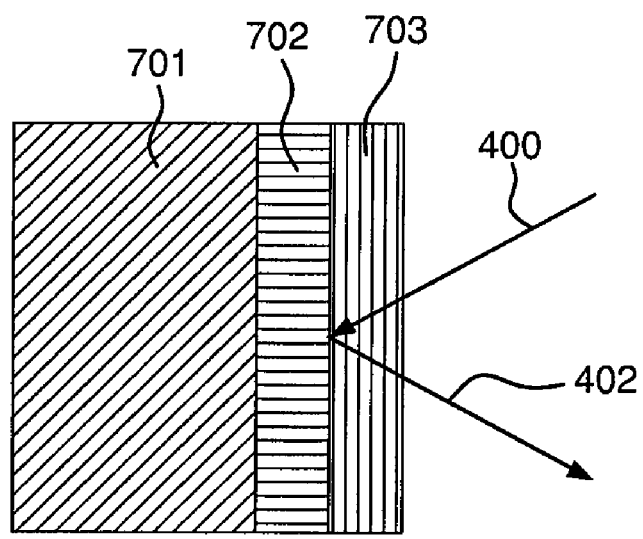
FIG. 7 is another diagram of a part of a reflector in accordance with yet another embodiment of the present invention.

Different configurations of reflector surfaces are shown in diagram in FIGS. 4, 5 and 6. In FIG. 4, the whole reflector sleeve 401 may be made out of silver that may be very pure and/or highly polished. For illustrative purposes, incoming ray 400 and reflective rays 402 are shown. A configuration of uncovered silver may be used in situations where the silver will not be tarnished. FIG. 5 shows another configuration in which sleeve 401 may be silver which is provided with a protective material 502 as described herein. FIG. 6 shows a reflector sleeve or lamphead surface 601 which is not silver, covered with a coating of silver 602. FIG. 7 shows a diagram of another configuration in which a reflector sleeve or lamphead 701 is covered with a silver layer 702 protected by a protective layer 703 as described herein. It is to be understood that while layers are shown as a single block, they may themselves in fact be of a multi-layer structure.

Furthermore, if the silver is to be properly adhered to a substrate such as a reflector sleeve or lamphead, it may also have an adhesion layer between the silver and the substrate. A diffusion barrier layer may also be applied.

In alternative embodiments, the reflector sleeve may comprise a thin quartz or other UV, VIS, NIR, or IR transparent material substrate, and instead of applying a silver coating to the inner surface of the sleeve, the outer surface can be coated to provide a back surface silver reflector on the transparent substrate. In that case, the reflective silver surface is protected by the substrate. The back silver surface may be left unprotected, and the silver thickness and slow sulfur diffusion may adequately protect the silver. Alternatively, the coating may be protected with some cheaper paint, as this protective coating does not need to be transparent since the coating is on the outer surface of the sleeve. The back surface may need to be protected from contaminant diffusion from lamphead materials during lamphead operation, but this coating is not required to be transparent and even providing a small gap between the lamphead and reflector may be sufficient.

The above described embodiments of the present inventions and their embodiments are related to processing chambers for processing of materials such as semiconductor substrates. Application of the embodiments of the present invention in a thin film and a solar film processing chamber is also contemplated. Other applications such as light reflection applications where a better more robust reflector is useful, light delivery systems, solar collectors, laser systems are also contemplated.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. A reflector for use in a rapid thermal processing chamber, comprising:
a reflector substrate disposed in the processing chamber to reflect radiation originating from a heating lamp mounted in the semiconductor processing chamber, the reflector substrate including an adhesion layer selected from one or more of nickel, nickel-chromium alloys and nitrided nickel-chromium alloys on the reflector substrate, a reflective layer disposed on the adhesion layer, the reflective layer comprising silver and positioned such that when the heating lamp is present, the reflective layer is between the reflector substrate and the heating lamp and a substantially transparent layer covering the reflective layer, the substantially transparent layer comprising a material suitable for use at temperatures in a rapid thermal processing chamber.

2. The reflector as claimed in claim 1, wherein the reflective layer comprises extremely pure silver with a silver content greater than 99.99%.

3. The reflector as claimed in claim 1, wherein the substantially transparent layer comprises a material selected from silica, quartz, alumina, zirconia, $Si_3N_4$, $CaF_2$, $MgF_2$, $TiO_2$, $Ta_2O_5$, $HfO_2$, yttria, and alumina-silica glass.

4. The reflector as claimed in claim 1, further comprising an adhesion layer between the reflective layer and a transparent layer.

5. The reflector as claimed in claim 1, further comprising a diffusion barrier between the reflective layer and the reflector substrate.

6. The reflector as claimed in claim 1, wherein the reflector substrate comprises a portion of monolithic lamphead having a plurality of cavities adapted to receive a lamp therein.

7. The reflector as claimed in claim 1, wherein the reflector substrate comprises a sleeve adapted to be disposed within a light pipe of a semiconductor processing chamber.

8. The reflector as claimed in claim 1, wherein the semiconductor processing chamber is a Rapid Thermal Processing chamber.

9. The reflector as claimed in claim 1, wherein the semiconductor processing chamber is an epitaxial processing chamber.

10. A rapid thermal processing apparatus, comprising:
a rapid thermal processing chamber having a support on which a substrate may be positioned during processing;
a heating lamp radiating radiant energy; and
a reflector positioned to reflect radiation from the lamp, the reflector including an adhesion layer selected from one or more of nickel, nickel-chromium alloys and nitrided nickel-chromium alloys on a reflector substrate and a reflective layer substantially made of silver on the adhesion layer, the reflective layer positioned between the reflector substrate and the heating lamp and a substantially transparent layer covering the reflective layer, the substantially transparent layer comprising a material suitable for use at temperatures in a rapid thermal processing chamber.

11. The semiconductor processing apparatus as claimed in claim 10, wherein the reflective layer is a layer of pure silver with a silver content greater than 99.99%.

12. The semiconductor processing apparatus as claimed in claim 11, wherein the substantially transparent layer comprises a material selected from silica, quartz, alumina, zirconia, $Si_3N_4$, $CaF_2$, $MgF_2$, $TiO_2$, $Ta_2O_5$, $HfO_2$, yttria, and alumina-silica glass.

13. The semiconductor processing apparatus as claimed in claim 12, further comprising an adhesion layer between the reflective layer and a transparent overcoat.

14. The semiconductor processing apparatus as claimed in claim 11, further comprising a diffusion barrier between the reflective layer and the reflector substrate.

15. The semiconductor processing apparatus of claim 10, wherein the reflector substrate comprises a portion of monolithic lamphead having a plurality of cavities adapted to receive a lamp therein.

16. The semiconductor processing apparatus of claim 10, wherein the reflector substrate comprises a sleeve adapted to be disposed within a light pipe of a semiconductor processing chamber.

17. The semiconductor processing apparatus of claim 10, wherein the reflective layer comprises a silver foil.

18. The semiconductor processing apparatus of claim 10, further comprising a channel in fluid communication with the lamphead, the lamphead surrounded by an atmosphere that is controlled to minimize the amount of sulfide-forming or sulfide-catalyzing materials.

* * * * *